(12) United States Patent
Chun et al.

(10) Patent No.: US 11,863,209 B2
(45) Date of Patent: Jan. 2, 2024

(54) INTEGRATED CIRCUIT AND METHOD CAPABLE OF MINIMIZING CIRCUIT AREA OF NON-VOLATILE MEMORY CIRCUIT

(71) Applicant: PixArt Imaging Inc., Hsin-Chu (TW)

(72) Inventors: Ee Wen Chun, Penang (MY); Shang Chan Kong, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 337 days.

(21) Appl. No.: 17/405,051

(22) Filed: Aug. 18, 2021

(65) Prior Publication Data

US 2023/0059746 A1    Feb. 23, 2023

(51) Int. Cl.
| | | |
|---|---|---|
| H03M 7/20 | (2006.01) | |
| H03M 7/30 | (2006.01) | |
| H03K 19/173 | (2006.01) | |
| G11C 17/12 | (2006.01) | |

(52) U.S. Cl.
CPC .......... *H03M 7/6041* (2013.01); *G11C 17/12* (2013.01); *H03K 19/1737* (2013.01); *H03M 7/3055* (2013.01)

(58) Field of Classification Search
CPC .... H03M 13/353; H03M 7/30; H03M 7/4043; H03M 7/02; H03M 7/16; H03M 7/4031; H03M 7/4056; H03M 7/4081; H03M 7/00; H03M 7/3082; G11C 29/44; G11C 11/40; G11C 16/22; G11C 17/146; G11C 17/16; G11C 17/18; G11C 2029/0411; G11C 29/12005; G11C 29/24; G11C 29/38; G11C 29/42; G11C 29/50016; G11C 29/52; G11C 29/702; G11C 29/72; G11C 29/76; G11C 29/78; G11C 29/781; G11C 29/785; G11C 29/789; G11C 7/24
USPC .......................................... 341/55, 102, 103
See application file for complete search history.

(56) References Cited

U.S. PATENT DOCUMENTS

| | | | | |
|---|---|---|---|---|
| 5,874,907 A * | 2/1999 | Craft | ................... | H03M 7/3084 341/51 |
| 7,834,652 B1 * | 11/2010 | Tang | ....................... | G06F 21/76 326/38 |
| 8,022,724 B1 * | 9/2011 | Jenkins, IV | ......... | H03K 19/177 326/38 |
| 8,627,105 B2 * | 1/2014 | Reese | ..................... | G06F 21/76 380/37 |
| 9,805,828 B1 * | 10/2017 | Yoko | .................... | G11C 29/702 |

(Continued)

*Primary Examiner* — Linh V Nguyen
(74) *Attorney, Agent, or Firm* — Winston Hsu

(57) ABSTRACT

A method of integrated circuit includes: providing a non-volatile memory circuit for securely and permanently recording and protecting key data content having Y bits; providing a programmable memory circuit for storing user configuration data content having X bits greater than Y bits; converting the user configuration data content having X bits into user configuration key content having Y bits; comparing the user configuration key content having Y bits with the key data content having Y bits; selecting fallback configuration data content having X bits as output data when the user configuration key content does not match the key data content; selecting the user configuration data content having X bits as the output data when the user configuration key content matches the key data content; and receiving the output data of the decision circuit and performing at least one corresponding capability operation according to the output data.

16 Claims, 2 Drawing Sheets

(56) References Cited

U.S. PATENT DOCUMENTS

| | | | |
|---|---|---|---|
| 2004/0139288 A1* | 7/2004 | Perego | G11C 7/1078 |
| | | | 711/156 |
| 2005/0015558 A1* | 1/2005 | Evans | G11C 7/1009 |
| | | | 711/154 |
| 2006/0131743 A1* | 6/2006 | Erickson | G06F 21/71 |
| | | | 257/737 |
| 2008/0061817 A1* | 3/2008 | Erickson | G06F 30/34 |
| | | | 326/8 |
| 2015/0006829 A1* | 1/2015 | Rajwan | G06F 11/3476 |
| | | | 711/154 |
| 2016/0188429 A1* | 6/2016 | Noguchi | G06F 11/1068 |
| | | | 714/6.21 |

* cited by examiner

US 11,863,209 B2

INTEGRATED CIRCUIT AND METHOD CAPABLE OF MINIMIZING CIRCUIT AREA OF NON-VOLATILE MEMORY CIRCUIT

BACKGROUND OF THE INVENTION

1. Field of the Invention

The invention relates to a mechanism of integrated circuit, and more particularly to an integrated circuit and corresponding method.

2. Description of the Prior Art

Generally speaking, existing electronic fuse implementations have multiple physical fuse bits (or called configuration bits), and each physical fuse bit stores exactly information of one capability bit. However, this causes a large circuit size for the implementations.

SUMMARY OF THE INVENTION

Therefore one of the objectives of the invention is to provide an integrated circuit, to solve the above-mentioned problems.

According to embodiments of the invention, an integrated circuit is disclosed. The integrated circuit comprises a non-volatile memory circuit, a programmable memory circuit, a decision circuit, and a processing circuit. The non-volatile memory circuit is used for securely and permanently recording and protecting a key data content having Y bits. The programmable memory circuit is used for storing a user configuration data content having X bits greater than Y bits. The decision circuit is coupled to the non-volatile memory circuit and the programmable memory circuit, and it is arranged for: receiving the key data content having Y bits and the user configuration data content having X bits; converting the user configuration data content having X bits into a user configuration key content having Y bits; comparing the user configuration key content having Y bits with the key data content having Y bits; selecting a fallback configuration data content having X bits as an output data when the user configuration key content does not match the key data content; and selecting the user configuration data content having X bits as the output data when the user configuration key content matches the key data content. The processing circuit is coupled to the decision circuit and is arranged for receiving the output data of the decision circuit and performing at least one corresponding capability operation according to the output data.

According to the embodiments, a method of an integrated circuit is disclosed. The method comprises: providing a non-volatile memory circuit for securely and permanently recording and protecting a key data content having Y bits; providing a programmable memory circuit for storing a user configuration data content having X bits greater than Y bits; converting the user configuration data content having X bits into a user configuration key content having Y bits; comparing the user configuration key content having Y bits with the key data content having Y bits; selecting a fallback configuration data content having X bits as an output data when the user configuration key content does not match the key data content; selecting the user configuration data content having X bits as the output data when the user configuration key content matches the key data content; and, receiving the output data of the decision circuit and performing at least one corresponding capability operation according to the output data.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a technical solution and circuit device capable of equivalently providing the same/similar configurations to the operations/functions of the functional blocks/circuits comprised within the circuit device by using fewer configuration bits, data compression/encoding operation, and data comparison operation, thereby minimizing the circuit area of a non-volatile memory circuit such as an electronic fuse (E-Fuse) array as well as retaining or holding the same/similar configurations to the operations/functions of the functional blocks/circuits. In addition, the provided technical solution and circuit device can increase the total addressable memory space used for storing information in the E-Fuse array(s) and/or can reduce the silicon area taken up by the E-Fuse array(s), thus effectively reducing the assembly, test and manufacturing cycle time as well as overall cost of manufacturing the circuit device such as a circuit chip.

The electronic fuse (E-Fuse) is a component in modern integrated circuit design intended for storing configuration bits which collectively define the various capabilities of the end product. Each system capability is assigned a dedicated bit within the E-Fuse block. For example, some system capabilities may require multiple bits to represent more variations of the supported features. The more capabilities a particular system has, the more bits of E-Fuse are required to be implemented in silicon. As the E-Fuse array size increases, aside from the increased silicon area incurred, the E-Fuse burn and verification cycle time during chip manufacturing will also be negatively impacted. Therefore it is often a tradeoff between manufacturing cost and marketing flexibility of configuring multiple SKUs when it comes to appropriately sizing the E-Fuse array during the chip design phase.

To overcome the aforementioned tradeoff, the provided technical solution and circuit device can enable a large number of system capabilities to be individually configured post-fabrication while only requires a relatively smaller E-Fuse array to be implemented on chip. Thus, each physical fuse bit in the provided technical solution and circuit device equivalently stores information of more than one capability bits.

Figure 1:
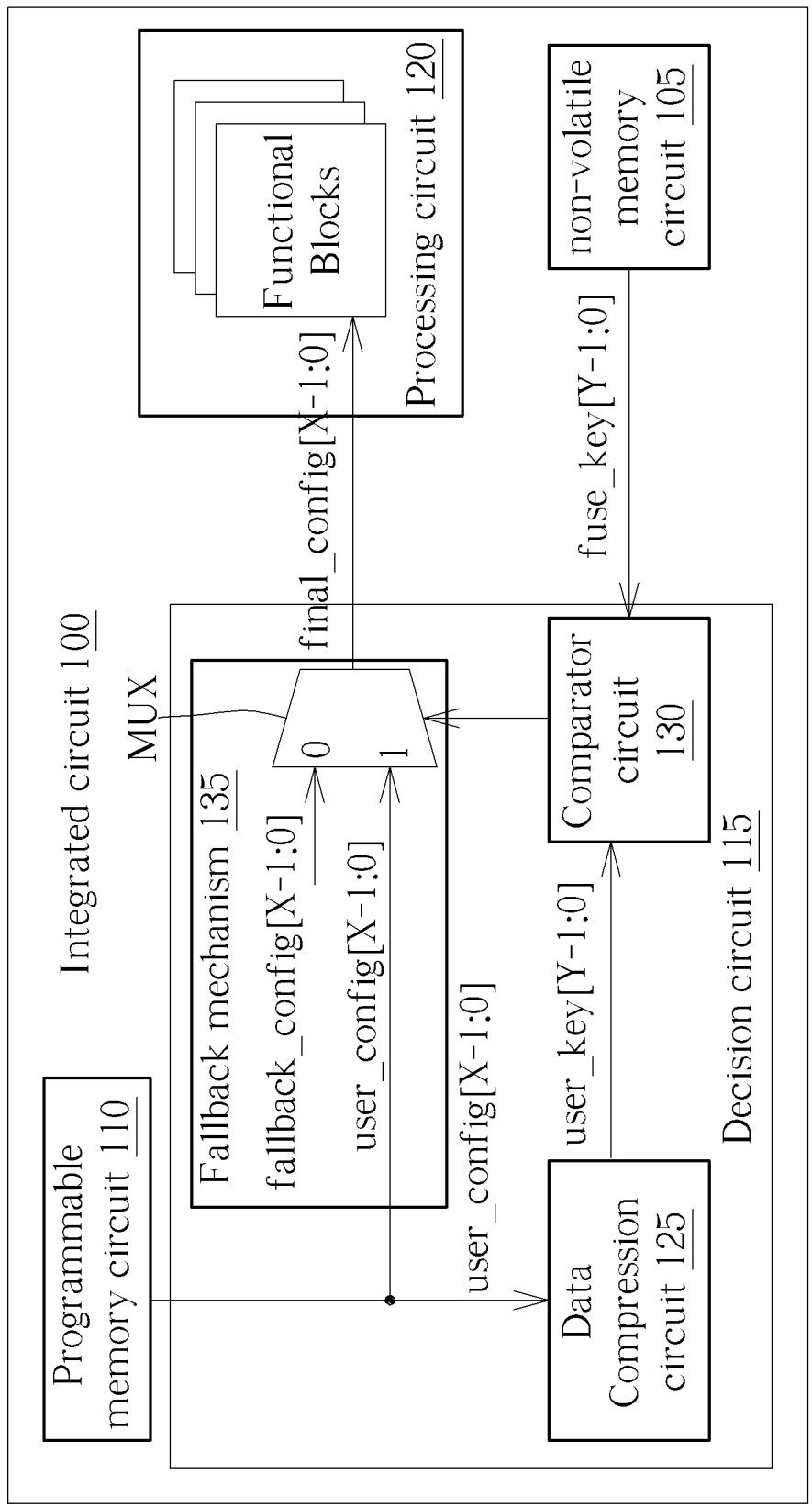
FIG. 1 is a block diagram of an integrated circuit according to an embodiment of the invention.

FIG. 1 is a block diagram of an integrated circuit 100 such as an integrated circuit chip or a system-on-chip device according to an embodiment of the invention. In FIG. 1, the integrated circuit 100 comprises a non-volatile memory circuit 105, a programmable memory circuit 110, a decision circuit 115, and a processing circuit 120. The decision circuit 115 comprises a data compression circuit 125, a comparator circuit 130, and a fallback mechanism block 135. The system of the integrated circuit 100 comprises a plurality of function blocks comprised within the processing circuit 120, and multiple configuration bits are used to provide corresponding configuration settings for the plurality of function blocks, to enable or disable at least one portion of functional blocks. For example, each configuration bit may set as '0' initially, and a configuration bit may be configured as '1' in response to different requirements.

The non-volatile memory circuit 105 is used for securely and permanently recording and protecting a key data content having Y bits. The non-volatile memory circuit 105 for example may be implemented by using or may comprise one or more actual electronic fuse arrays, one time programmable read-only memory (OTP ROM), electrically erasable programmable read-only memory (EEPROM), flash memory or other technologies as long as the key data content having Y bits indicated by the signal fuse_key[Y−1:0] in FIG. 1 can be permanently set by a chip manufacturer and electronically protected such that it cannot be erased or tampered by unauthorized parties. The key data content fuse_key[Y−1:0] for example is a compressed or encoded data content generated from X number of capability bits of the user configuration data content set by the chip manufacturer. The key data content fuse_key[Y−1:0] cannot be changed by the user once it is set.

The programmable memory circuit 110 is used for storing a user configuration data content having X bits wherein the number X is larger/greater than the number Y. The programmable memory circuit 110 may be implemented by using or may comprise a user programmable memory, a bank of flip-flops, a bank of latches, register file, a static random access memory (SRAM), or a dynamic random access memory (DRAM) as long as it is programmable by the user and that the programmed value is accessible by other logic blocks of the system. The programmed value, i.e. the X capability bits of the user configuration data content, is indicated by the signal user_config [X−1:0], and it will be transmitted to two blocks, i.e. the data compression circuit 125 and the fallback mechanism 135 in the decision circuit 115.

The decision circuit 115 is coupled to the non-volatile memory circuit 105 and the programmable memory circuit 110, and it is arranged for receiving the key data content having the Y bits (i.e. fuse_key [Y−1:0]) and the user configuration data content having the X bits (i.e. user_config [X−1:0]), converting the user configuration data content having the X bits (user_config [X−1:0]) into a user configuration key content having Y bits (i.e. user_key [Y−1:0]), comparing the user configuration key content having the Y bits (user_key [Y−1:0]) with the key data content having Y bits (fuse_key [Y−1:0]), selecting a fallback configuration data content having X bits (fallback_config [X−1:0]) as an output data when the user configuration key content (user_key [Y−1:0]) does not match the key data content (fuse_key [Y−1:0]), and selecting the user configuration data content having X bits (user_key [Y−1:0]) as the output data when the user configuration key content (user_key [Y−1:0]) matches the key data content (fuse_key [Y−1:0]).

That is, the decision circuit 115 is used to generate more resultant configuration bits for the functions blocks according to the fewer preliminary configuration bits stored in the non-volatile memory circuit 105 and the information stored in the user programmable memory circuit 110. Thus, the circuit area of the non-volatile memory circuit 105 can be minimized or reduced, and the storage space of the user programmable memory circuit 110 can be increased.

In practice, the data compression circuit 125 for example is a compression/encoder logic (or circuit) which may use a variety of operations or algorithms such as Hamming Code, checksums, Cyclic Redundancy Check (CRC), hash algorithms and other data compression algorithms. The above-mentioned algorithms can process a large amount of data to generate or produce a smaller amount of data/key/signature. For instance, the Hamming Code operation can be used to produce a 6-bit parity signature from a 26-bit input data and an 8-bit parity signature from a 120-bit input data, to effectively reduce the E-Fuse array size requirements by 77% and 93% respectively; however, this is not intended to be a limitation. As shown in FIG. 1, the data compression circuit 125 performs a data compression/encoding operation upon the X bits of user configuration data content stored in the programmable memory circuit 110, indicated by user_config [X−1:0], to compress the user configuration data content having X bits to generate the user configuration key content having Y bits (indicated by the signal user_key [Y−1:0]) smaller than X bits.

Then, the comparator circuit 130 is arranged to receive the bits of signal user_key [Y−1:0] from the data compression circuit 125, receive the bits of signal fuse_key [Y−1:0] from the non-volatile memory circuit 105, compare the bits/value of signal user_key [Y−1:0] with the bits/value of signal fuse_key [Y−1:0] to generate a comparison signal, and report the information of such comparison signal to the fallback mechanism 135 wherein the comparison signal indicates whether the information of signal user_key [Y−1:0] matches that of signal fuse_key [Y−1:0] or not. If the bits/value of signal user_key[Y−1:0] matches the bits/value of signal fuse_key[Y−1:0] (i.e. the user configuration matches the intended configuration set by the chip manufacturer for the integrated circuit 100), then the content of the report signal, transmitted from the comparator circuit 130 to the multiplexer MUX, may be set as '1' and the multiplexer MUX based on the bit '1' of the report signal is arranged to selects the signal user_config [X−1:0] as its output. Instead, if the bits/value of signal user_key [Y−1:0] do not match the bits/value of signal fuse_key [Y−1:0] (i.e. the user configuration does not match the intended configuration set by the chip manufacturer), then the content of the report signal, transmitted from the comparator circuit 130 to the multiplexer MUX, may be set as '0' and the multiplexer MUX based on the bit '0' of the report signal is arranged to selects a fallback configuration signal having X number of bits, indicated by the signal fallback_config [X−1:0], as its output.

The fallback mechanism 135 as shown in FIG. 1 comprises the multiplexer MUX which may be implemented by an array of multiplexers. In this embodiment, the fallback configuration signal having X number of bits indicated by the signal fallback_config[X−1:0] is for example an alternate configuration pattern signal set by the chip manufacturer that either denies the system from functioning, partially disable or cripple system capabilities, or even enter a special operating mode to inform the user of the mismatch and possibly allow the user to troubleshoot and correct the problem. That is, when the fallback configuration data fallback_config[X−1:0] is received by the processing circuit 120, the processing circuit 120 may performs at least one of denying a system from functioning, partially disabling or crippling system capabilities, entering a special operating mode to inform a user of mismatch, and allowing the user to troubleshoot and correct a specific problem. When the problem is corrected, the final configuration signal having X number of bits indicated by the signal final_config[X−1:0] is generated from the output of the multiplexer MUX to the processing circuit 120, and the final configuration signal is selected from the signal user_config[X−1:0] if the bit of report signal is equal to '1'. In this situation, the full capabilities defined/specified by the chip manufacturer become available for use by the functional blocks comprised by the processing circuit 120.

The processing circuit 120 is coupled to the decision circuit 115, and it is used for receiving the output data (i.e. signal final_config[X−1:0]) of the decision circuit 115 and performing at least one corresponding capability operation according to the output data. For example, one or more functional blocks comprised by the processing circuit 120 are arranged to execute one or more corresponding functions and operations based on the configuration information indicated by the configuration bits carried by the signal final_config[X−1:0].

By doing so, the provided integrated circuit employing the data compression and comparison operations with fewer configuration/physical bits stored in the E-Fuse array(s) can equivalently achieve the functional blocks' capabilities corresponding to more configuration/physical bits. Thus, the circuit silicon area of E-Fuse array(s) can be significantly reduced.

Further, the numbers X and Y and the relation between X and Y can be determined the type of data compression or the encoding algorithm used by the system of integrated circuit 100 or is specific to the used data compression or used encoding algorithm. For example, the number X is designed to be larger/greater than the number Y so as to provide more actual technical benefits.

Further, it should be noted that in other embodiments the integrated circuit 100 as shown in FIG. 1 can be synthesized as a netlist circuit or implemented as an application specific integrated circuit (ASIC). In one embodiment, the integrated circuit 100 can be emulated by a programmable hardware circuit. Further, in one embodiment, the integrated circuit 100 can be implemented by using discrete hardware components. Further, in one embodiment, the integrated circuit 100 can be partially implemented by software components.

Figure 2:
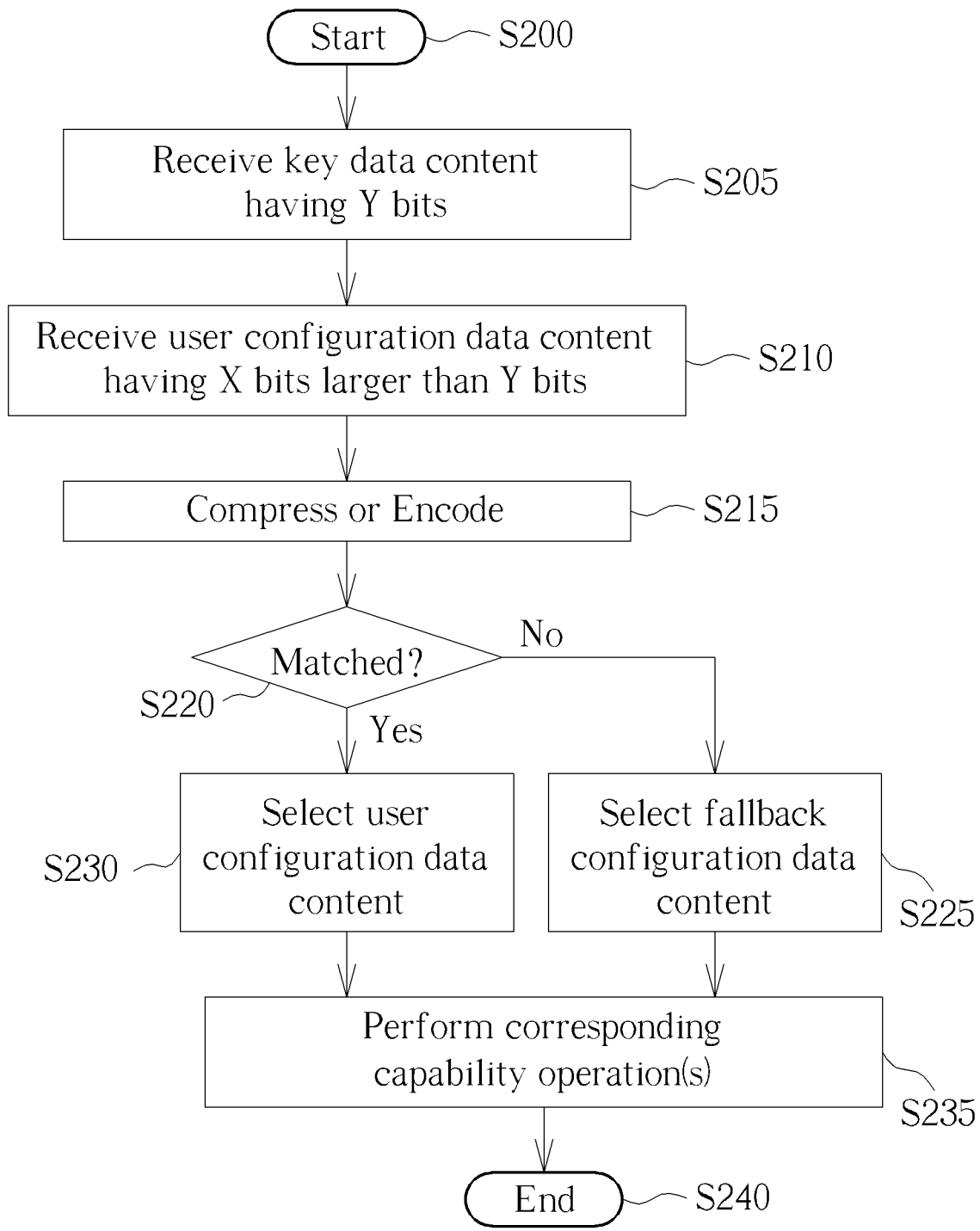
FIG. 2 is a flowchart diagram of a method of the integrated circuit as shown in FIG. 1 according to an embodiment of the invention.

To make readers more clearly understand the spirits of the invention, FIG. 2 is provided. FIG. 2 is a flowchart diagram of a method of the integrated circuit 100 as shown in FIG. 1 according to an embodiment of the invention. The description of steps is described in the following:

Step S200: Start;
Step S205: Receive a key data content having Y bits stored in a non-volatile memory circuit which securely and permanently records and protects the key data content having Y bits;
Step S210: Receive a user configuration data content having X bits greater than Y bits from a programmable memory circuit;
Step S215: Compress or Encode the user configuration data content having X bits to generate a user configuration key content having Y bits which are fewer than X bits;
Step S220: Compare the user configuration key content having Y bits with the key data content having Y bits to determine whether the contents are matched; if the contents are not matched, then the flow proceeds Step S225, otherwise, the flow proceeds Step S230;
Step S225: Select a fallback configuration data content having X bits as an output data
Step S230: Selecting the user configuration data content having X bits as the output data;
Step S235: Performing at least one corresponding capability operation according to output data; and
Step S240: End.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit, comprising:
a non-volatile memory circuit, for securely and permanently recording and protecting a key data content having Y bits;
a programmable memory circuit, for storing a user configuration data content having X bits greater than Y bits;
a decision circuit, coupled to the non-volatile memory circuit and the programmable memory circuit, arranged for:
receiving the key data content having Y bits and the user configuration data content having X bits;
converting the user configuration data content having X bits into a user configuration key content having Y bits;
comparing the user configuration key content having Y bits with the key data content having Y bits;
selecting a fallback configuration data content having X bits as an output data when the user configuration key content does not match the key data content; and
selecting the user configuration data content having X bits as the output data when the user configuration key content matches the key data content; and
a processing circuit, coupled to the decision circuit, for receiving the output data of the decision circuit and performing at least one corresponding capability operation according to the output data.

2. The integrated circuit of claim 1, wherein the decision circuit comprises:
a data compression circuit, for compressing the user configuration data content having X bits to generate the user configuration key content having Y bits smaller than X bits;
a comparator circuit, coupled to the data compression circuit, for comparing the user configuration key content having Y bits with the key data content having Y bits to generate a comparison signal; and
a multiplexer, coupled to the programmable memory circuit and the comparator circuit, for:
selecting the fallback configuration data content having X bits as the output data of the decision circuit when the comparison signal indicates that the user configuration key content does not match the key data content; and
selecting the user configuration data content having X bits as the output data when the comparison signal indicates that the user configuration key content matches the key data content.

3. The integrated circuit of claim 2, wherein the data compression circuit employs a hamming code operation, a checksum operation, a cyclic redundancy check operation, or a hash algorithm.

4. The integrated circuit of claim 1, wherein when the fallback configuration data is received, the at least one corresponding capability operation, performed by the processing circuit, comprises at least one of the followings: denying a system from functioning, partially disabling or crippling system capabilities, entering a special operating mode to inform a user of mismatch, and allowing the user to troubleshoot and correct a specific problem.

5. The integrated circuit of claim 4, wherein after the specific problem is corrected, the decision circuit is arranged to select the user configuration data content having X bits as the output data.

6. The integrated circuit of claim 1 being synthesized as a netlist circuit or implemented as an application specific integrated circuit.

7. The integrated circuit of claim 1 being emulated by a programmable hardware circuit.

8. The integrated circuit of claim 1 being implemented by using discrete hardware components.

9. The integrated circuit of claim 1 being partially implemented by software components.

10. The integrated circuit of claim 1, wherein the non-volatile memory circuit comprises a one-time-programmable read-only memory, an electrically-erasable programmable read-only memory, or a flash memory.

11. The integrated circuit of claim 1, wherein the programmable memory circuit comprises a bank of flip-flops, a bank of latches, a register file, a static random access memory, or a dynamic random access memory.

12. A method of an integrated circuit, comprising:
   providing a non-volatile memory circuit for securely and permanently recording and protecting a key data content having Y bits;
   providing a programmable memory circuit for storing a user configuration data content having X bits greater than Y bits;
   converting the user configuration data content having X bits into a user configuration key content having Y bits;
   comparing the user configuration key content having Y bits with the key data content having Y bits;
   selecting a fallback configuration data content having X bits as an output data when the user configuration key content does not match the key data content;
   selecting the user configuration data content having X bits as the output data when the user configuration key content matches the key data content; and
   receiving the output data of the decision circuit and performing at least one corresponding capability operation according to the output data.

13. The method of claim 12, wherein the converting step comprises:
   compressing the user configuration data content having X bits to generate the user configuration key content having Y bits smaller than X bits; and
   the comparing step comprises:
      using a comparator circuit to compare the user configuration key content having Y bits with the key data content having Y bits to generate a comparison signal.

14. The method of claim 13, wherein the compressing step employs a hamming code operation, a checksum operation, a cyclic redundancy check operation, or a hash algorithm.

15. The method of claim 12, wherein when the fallback configuration data is received, the method further comprises at least one of the followings: denying a system from functioning, partially disabling or crippling system capabilities, entering a special operating mode to inform a user of mismatch, and allowing the user to troubleshoot and correct a specific problem.

16. The method of claim 15, further comprising:
   after the specific problem is corrected, selecting the user configuration data content having X bits as the output data.

* * * * *